United States Patent
Yang

(10) Patent No.: US 10,073,231 B1
(45) Date of Patent: Sep. 11, 2018

(54) HEAT SINK ATTACHING STRUCTURE AND ELECTRICAL CONNECTOR CAGE ASSEMBLY

(71) Applicant: ALL BEST PRECISION TECHNOLOGY CO., LTD., Taoyuan (TW)

(72) Inventor: Haven Yang, Taoyuan (TW)

(73) Assignee: ALL BEST PRECISION TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 15/640,605

(22) Filed: Jul. 3, 2017

(30) Foreign Application Priority Data

May 17, 2017 (TW) .............................. 106207024 U

(51) Int. Cl.
| | |
|---|---|
| *G02B 6/42* | (2006.01) |
| *H01L 23/40* | (2006.01) |
| *H05K 7/20* | (2006.01) |
| *H01R 13/502* | (2006.01) |

(52) U.S. Cl.
CPC ......... *G02B 6/4269* (2013.01); *H01R 13/502* (2013.01); *F28F 2275/08* (2013.01); *H01L 23/4093* (2013.01); *H05K 7/2049* (2013.01)

(58) Field of Classification Search
CPC ... H05K 7/2049; H01L 23/40; H01L 23/4093; H01L 24/72; F28F 2275/08; G02B 6/4266–6/4273; H01R 13/6581; H01R 24/28; H01R 24/64; H01R 25/006; H01R 2107/00

USPC ....... 361/704, 709–710, 716; 165/80.2–80.3; 257/718–719; 24/458–459, 520; 411/107, 353; 248/220.21, 222.2, 222.14, 248/560

See application file for complete search history.

(56) References Cited

U.S. PATENT DOCUMENTS

| | | | | |
|---|---|---|---|---|
| 6,980,437 | B2 * | 12/2005 | Bright | H04B 1/036 165/185 |
| 7,539,018 | B2 * | 5/2009 | Murr | H05K 7/20418 165/185 |
| 8,885,342 | B2 * | 11/2014 | Skepnek | H01L 23/367 174/548 |
| 2008/0137306 | A1 * | 6/2008 | Kim | H05K 9/0058 361/709 |

* cited by examiner

*Primary Examiner* — Zachary M Pape
(74) *Attorney, Agent, or Firm* — Winston Hsu

(57) ABSTRACT

An electrical connector cage assembly includes a casing, a first heat sink, a second heat sink, and a heat sink attaching structure. The casing can accommodate at least one electrical connector. The heat sink attaching structure includes a connecting part, a first engagement part, a second engagement part, a first attaching part, and a second attaching part. The connecting part protrudes out of a top wall of the casing. The first and second engagement parts are disposed on two opposite side walls of the casing respectively. The first and second attaching parts are connected to the connecting part. The first and second attaching parts detachably clip to the first and second engagement parts for attaching the first and second heat sinks on the top wall respectively.

17 Claims, 9 Drawing Sheets

HEAT SINK ATTACHING STRUCTURE AND ELECTRICAL CONNECTOR CAGE ASSEMBLY

BACKGROUND OF THE INVENTION

1. Field of the Invention

The invention relates to a heat-dissipating structure, and especially relates to an attaching structure for a heat-dissipating structure of a device casing.

2. Description of the Prior Art

As electronic devices tend to produce more and more heat when in operation, a variety of heat-dissipating structures are widely used for dissipating heat. For the convenience of installing heat sinks, some heat-dissipating structures are provided with an attaching structure that attaches a heat sink onto an electronic component (e.g. a chip) producing much heat or onto a casing of an electronic device (e.g. a power supply) producing much heat. In the art of heat dissipation of electronic components, an attaching structure, for example disclosed in U.S. Pat. No. 5,953,212, is used for attaching a heat sink 60 on a central processing unit 70, as shown by FIG. 1. The attaching structure includes a clip 10, a flap 40 hooking an end of the clip 10, and mounting ears 82 and 82' oppositely disposed on a central processing unit connector 80. In an installation of the heat sink 60, the clip 10 attaches the heat sink 60 on the central processing unit 70 by a locking portion 18 at another end of the clip 10 engaging with the mounting ear 82 and by the flap 40 engaging with the mounting ear 82'. In the art of heat dissipation of device casings, an attaching structure, for example disclosed in U.S. Pat. No. 7,539,018, is used for attaching a heat sink on a device casing 12, as shown by FIG. 2. The attaching structure includes a clip 28, a latch 74 disposed on the device casing 12 for an end of the clip 28 to hook, and a protrusive tab disposed on the device casing 12 for another end of the clip 28 to engage with. In an installation of the heat sink, the clip 28 attaches the heat sink on the device casing 12 by an end of the clip 28 hooking the latch 74 and by another end of the clip 28 engaging with the protrusive tab. In the former, the attaching structure includes more components. In the latter, the attaching structure needs to be disposed across the device casing 12 for attaching the heat sink; therein, if the clip 28 is too long, it is inconvenient to attach the heat sink on the device casing 12 firmly, which limits the disposition orientation of the clip 28 on the device casing 12.

SUMMARY OF THE INVENTION

An objective of the invention is to provide a heat sink attaching structure and an electrical connector cage assembly having the heat sink attaching structure. The heat sink attaching structure includes two attaching parts disposed oppositely. The two attaching parts use the same connecting part protrusively disposed on a top wall of a casing and engage with two engagement parts disposed oppositely on two opposite side walls of the casing respectively.

A heat sink attaching structure according to the invention includes a connecting part, a first engagement part, a second engagement part, a first attaching part, and a second attaching part. The connecting part protrudes out of a top wall of a casing. The first engagement part is disposed on a first side wall of the casing. The second engagement part is disposed on a second side wall of the casing. The first side wall and the second side wall are located at two opposite sides of the top wall. The first attaching part includes a first clipping portion, a first hooking portion, and a first connecting arm. The first connecting arm connects the first clipping portion and the first hooking portion. The first hooking portion is engaged with the connecting part and the first clipping portion detachably clips the first engagement part, for attaching a first heat sink on the top wall. The second attaching part includes a second clipping portion, a second hooking portion, and a second connecting arm. The second connecting arm connects the second clipping portion and the second hooking portion. The second hooking portion is engaged with the connecting part and the second clipping portion detachably clips the second engagement part, for attaching a second heat sink on the top wall.

An electrical connector cage assembly according to the invention includes a casing, a first heat sink, a second heat sink, and the above-mentioned heat sink attaching structure. The casing has a top wall, a first side wall, and a second side wall. The first side wall and the second side wall are oppositely connected to two opposite sides of the top wall respectively. The top wall, the first side wall, and the second side wall form an accommodating space therebetween. The accommodating space can accommodate at least one electrical connector. The first heat sink includes a first base and a plurality of first fins. The first fins extend from the first base. The second heat sink includes a second base and a plurality of second fins. The second fins extend from the second base. The heat sink attaching structure attaches the first heat sink and the second heat sink on the top wall.

Compared with the prior art, according to the invention, it is practicable to use three components, i.e. a single attaching part with the cooperation of a connecting part and a corresponding engagement part, for the purpose of attaching a heat sink on a casing. The single attaching part does not need to be disposed across the casing for attaching the heat sink, which can enhance the disposition flexibility of the heat sink on the casing. Furthermore, the two attaching parts of the heat sink attaching structure according to the invention use the same connecting part, which is conducive to a quantity reduction of the components of the heat sink attaching structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
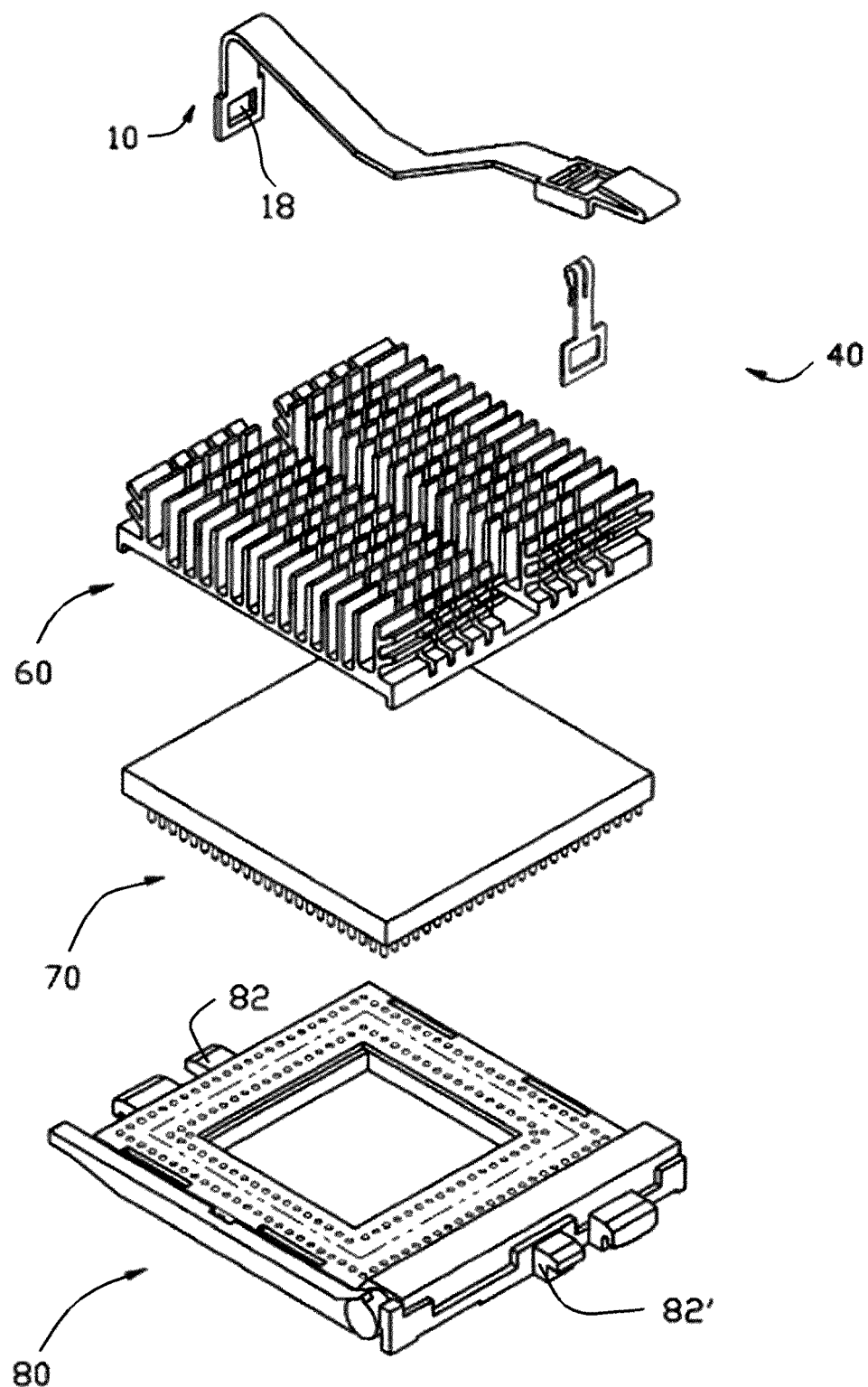
FIG. 1 is a schematic diagram illustrating an attaching structure in the prior art.
Figure 2:
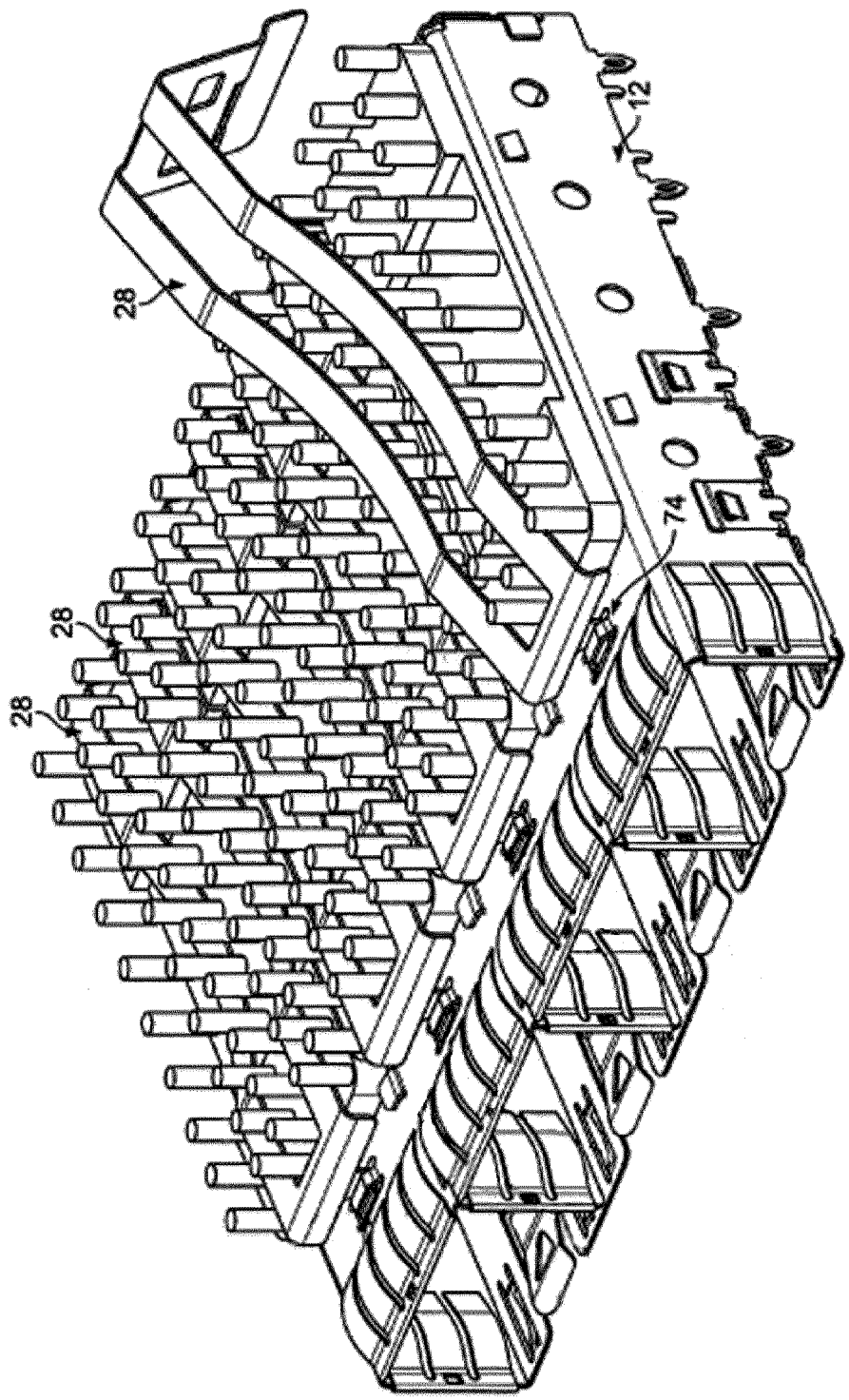
FIG. 2 is a schematic diagram illustrating another attaching structure in the prior art.
Figure 3:
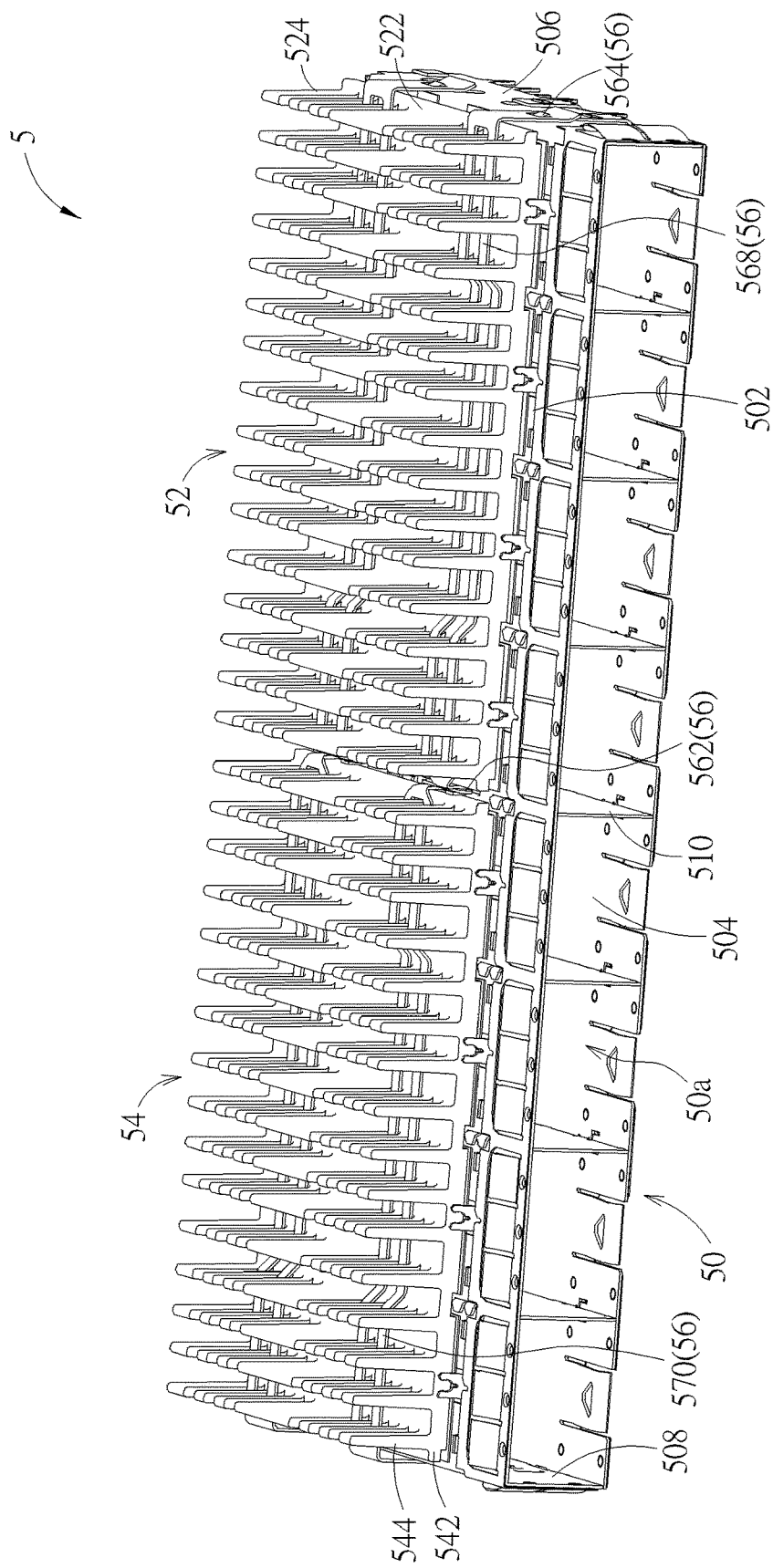
FIG. 3 is a schematic diagram illustrating an electrical connector cage assembly of an embodiment according to the invention.
Figure 4:
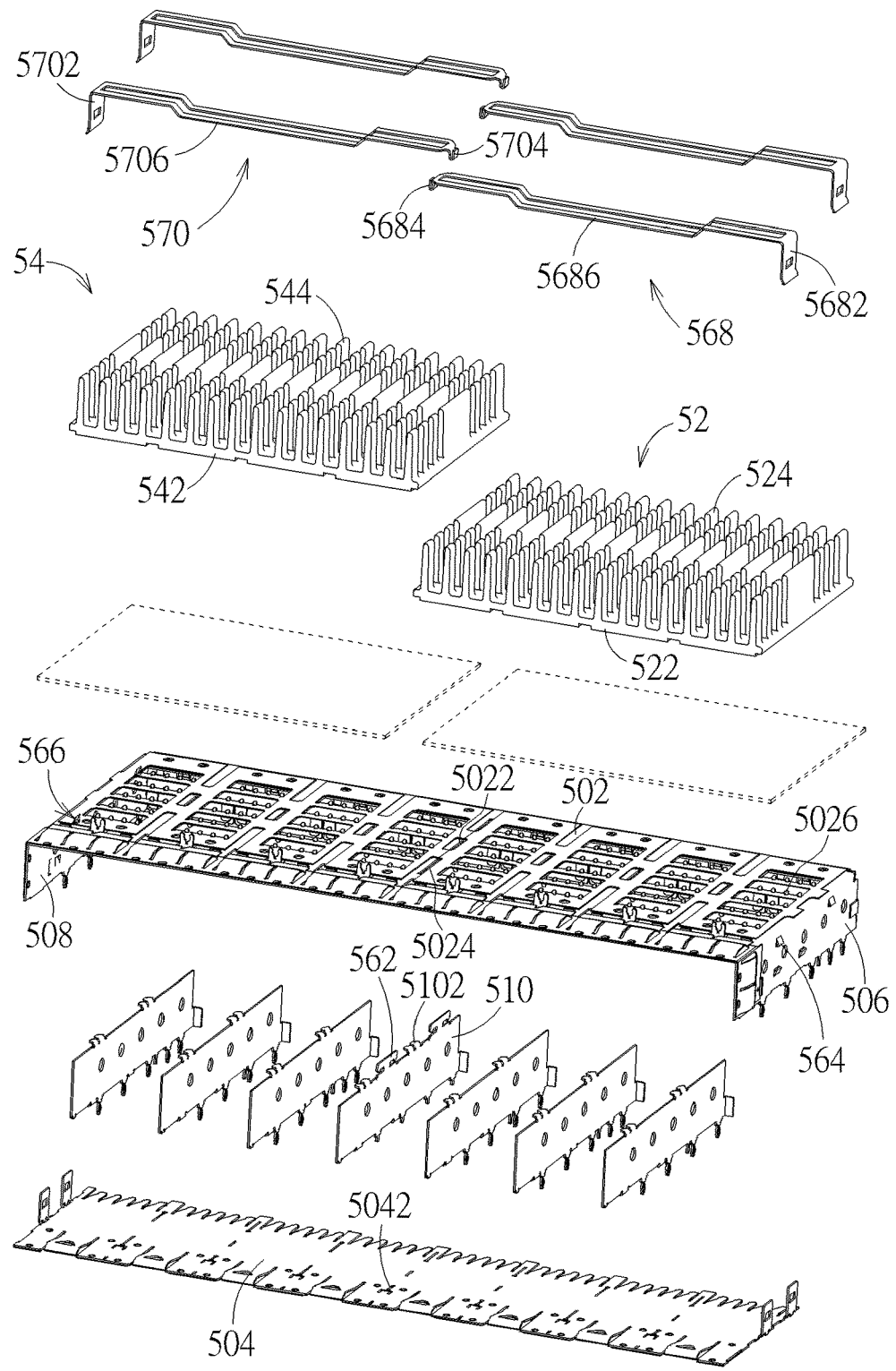
FIG. 4 is an exploded view of the electrical connector cage assembly in FIG. 3.
Figure 5:
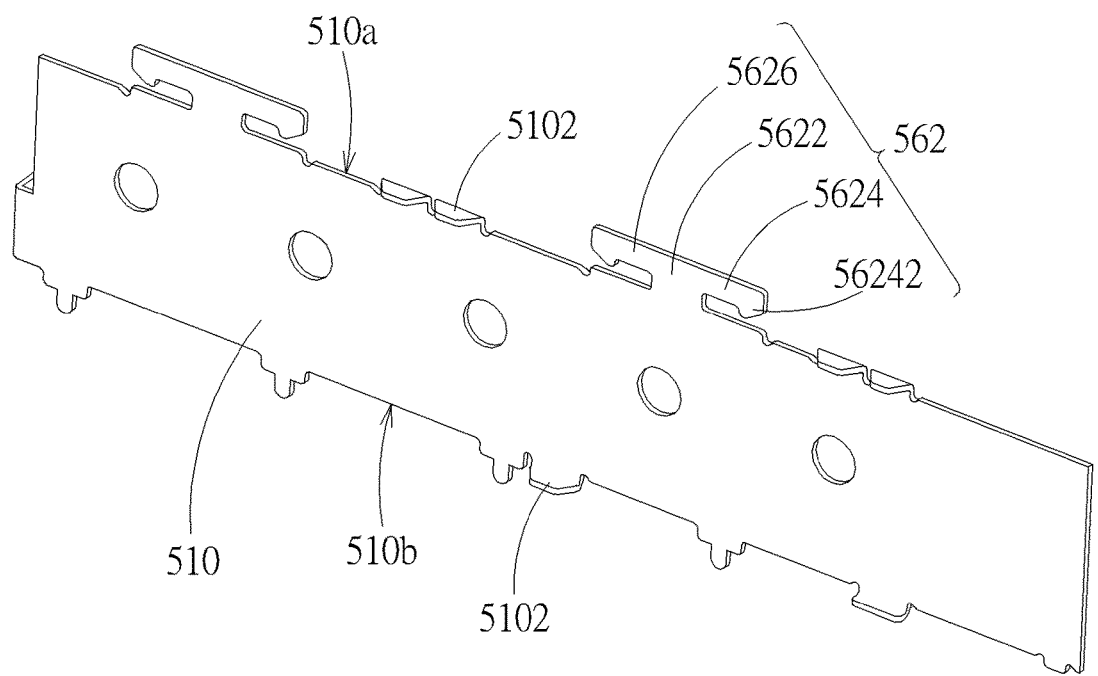
FIG. 5 is a schematic diagram illustrating a partition plate of a casing of the electrical connector cage assembly in FIG. 4 in another view point.

Please refer to FIG. 3 to FIG. 8. An electrical connector cage assembly 5 of an embodiment according to the invention includes a casing 50, a first heat sink 52, a second heat sink 54, and a heat sink attaching structure 56. The heat sink attaching structure 56 attaches the first heat sink 52 and the second heat sink 54 on the casing 50 in a detachable way, so that the first heat sink 52 and the second heat sink 54 can dissipate heat transferred from electrical connectors (not shown in the figures) disposed inside the casing 50.

In the embodiment, the casing 50 has a top wall 502, a bottom wall 504, a first side wall 506, a second side wall 508 and a plurality of partition plate 510. The top wall 502 and the bottom wall 504 are disposed oppositely. The first side wall 506 and the second side wall 508 are connected to two opposite sides of the top wall 502 respectively and are also connected to two opposite sides of the bottom wall 502 respectively, which forms an accommodating space 50a. The accommodating space 50a can accommodate at least one electrical connector. The partition plate 510 is disposed in the accommodating space 50a to divide accommodating space 50a into a plurality of sub-spaces. Each sub-space can accommodate one electrical connector. In the embodiment, the partition plate 510 is fixedly connected to the top wall 502 and the bottom wall 504 by side edges 510a and 510b of the partition plate 510. Therein, the partition plate 510 has a plurality of bent portions 5102 at the side edges 510a and 510b. The top wall 502 and the bottom wall 504 have engagement holes 5022 and 5042 correspondingly. The bent portions 5102 protrude out of the top wall 502 and the bottom wall 504 through the corresponding engagement holes 5022 and 5042 and are engaged with the corresponding engagement holes 5022 and 5042. In practice, the top wall 502, the first side wall 506 and the second side wall 508, even together with the bottom wall 504, can be structurally integrated into a single part, e.g. by pressing a metal sheet.

The first heat sink 52 includes a first base 522 and a plurality of first fins 524. The first fins 524 extend outwards from the first base 522. The second heat sink 54 includes a second base 542 and a plurality of second fins 544. The second fins 544 extend outwards from the second base 542.

The heat sink attaching structure 56 includes a connecting part 562, a first engagement part 564, a second engagement part 566 (shown by hidden lines in FIG. 4), a first attaching part 568, and a second attaching part 570. The connecting part 562 protrudes out of the top wall 502. The first engagement part 564 is disposed on the first side wall 506. The second engagement part 566 is disposed on the second side wall 508. The first attaching part 568 is used for attaching the first heat sink 52 on the top wall 502 firmly. The first attaching part 568 includes a first clipping portion 5682, a first hooking portion 5684, and a first connecting arm 5686. The first connecting arm 5686 connects the first clipping portion 5682 and the first hooking portion 5684. When the first attaching part 568 attaches the first heat sink 52 on the top wall 502, the first hooking portion 5684 is engaged with the connecting part 562, the first clipping portion 5682 detachably clips the first engagement part 564, and the first connecting arm 5686 passes through the first fins 524 and presses the first base 522 tightly on the top wall 502. The second attaching part 570 is used for attaching the second heat sink 54 on the top wall 502 firmly. The second attaching part 570 includes a second clipping portion 5702, a second hooking portion 5704, and a second connecting arm 5706. The second connecting arm 5706 connects the second clipping portion 5702 and the second hooking portion 5704. When the second attaching part 570 attaches the second heat sink 54 on the top wall 502, the second hooking portion 5704 is engaged with the connecting part 562, the second clipping portion 5702 detachably clips the second engagement part 566, and the second connecting arm 5706 passes through the second fins 544 and presses the second base 542 tightly on the top wall 502.

Figure 7:
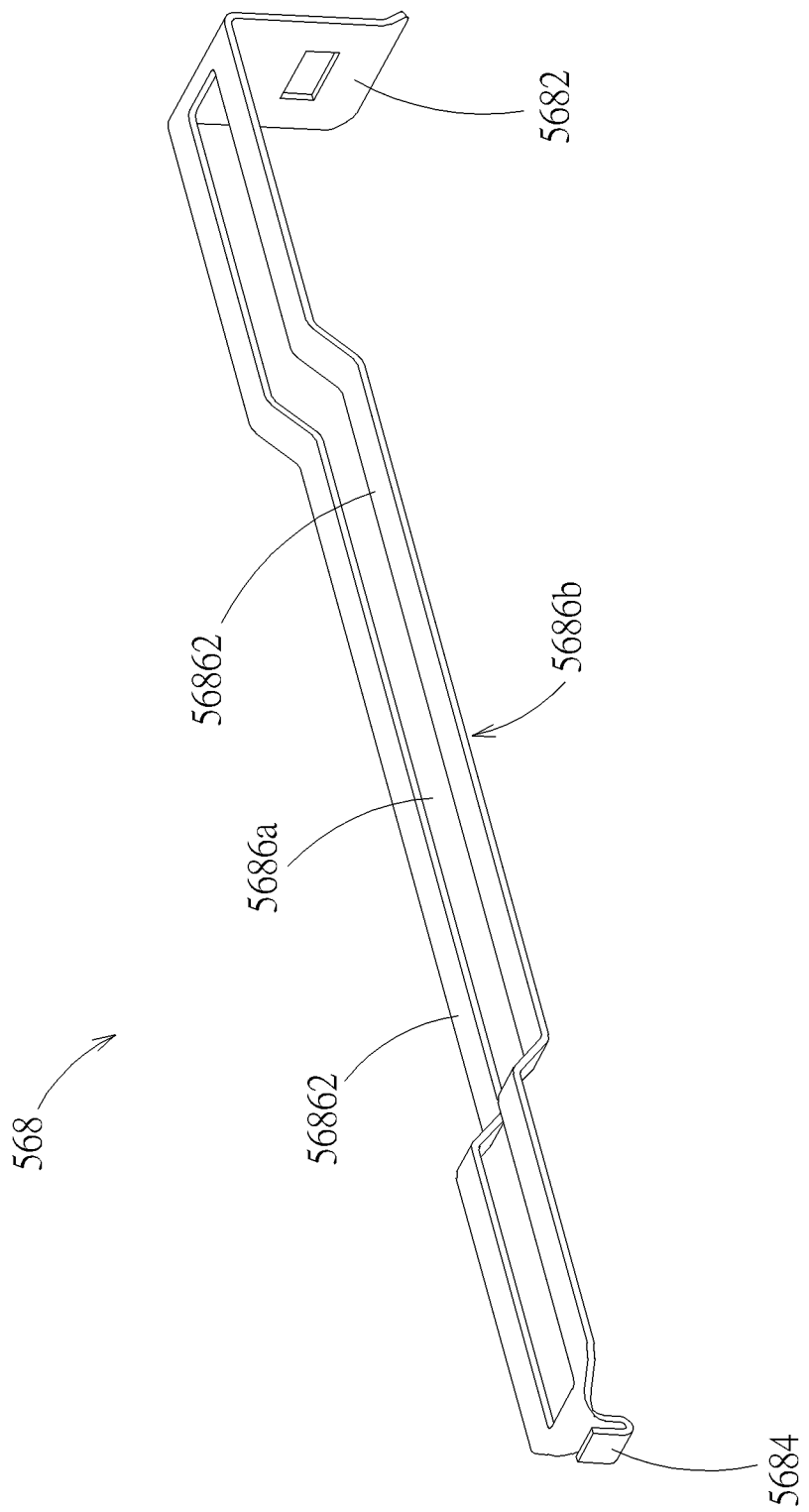
FIG. 7 is a schematic diagram illustrating a first attaching part of the heat sink attaching structure of the electrical connector cage assembly in FIG. 3.
Figure 8:
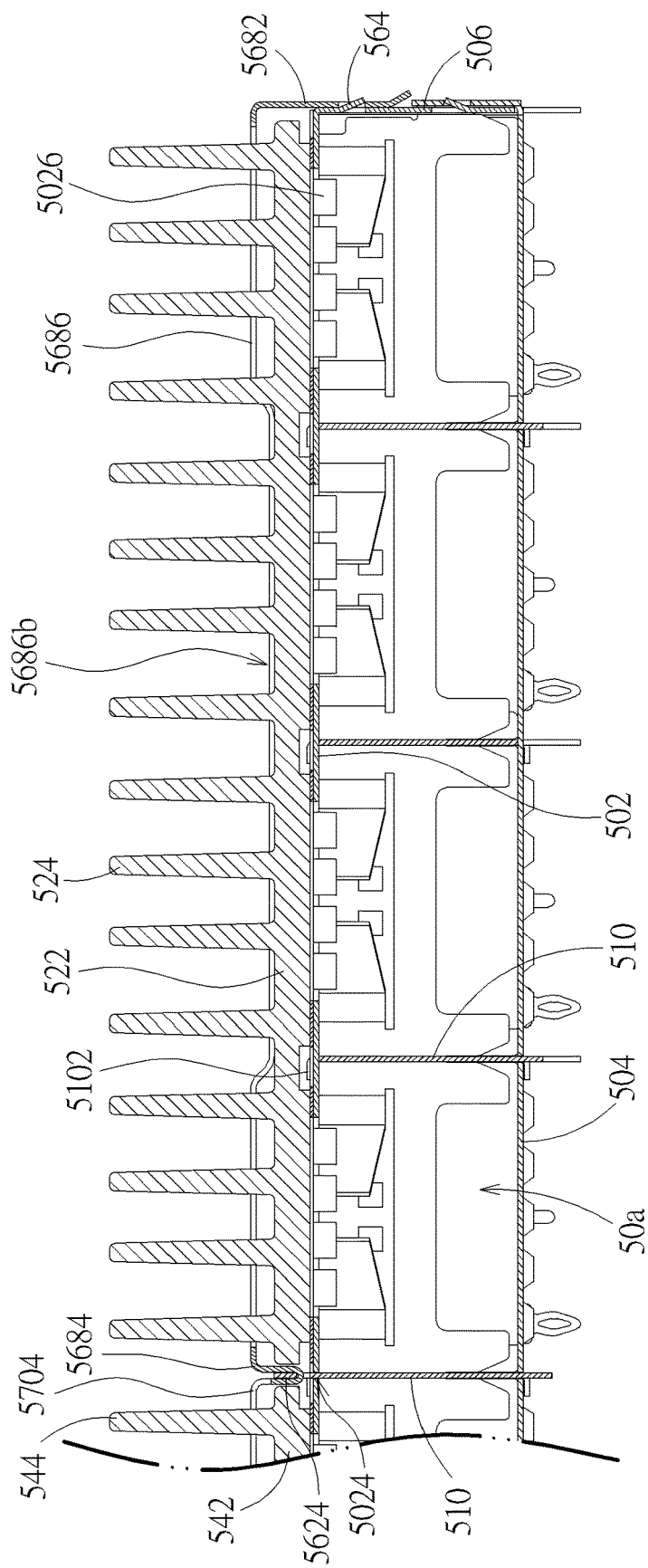
FIG. 8 is a sectional view of the electrical connector cage assembly in FIG. 3.

For more details, as shown by FIG. 7, the first connecting arm 5686 of the first attaching part 568 includes two long arms 56862. Two ends of each long arm 56862 are connected to the first clipping portion 5682 and the first hooking portion 5684 respectively. The two long arms 56862, the first clipping portion 5682, and the first hooking portion 5684 form a long slot 5686a therebetween. When the first attaching part 568 attaches the first heat sink 52 on the top wall 502, at least one of the first fins 524 passes through the long slot 5686a. Thereby, the first attaching part 568 can locate the first heat sink 52 through the long slot 5686a. In practice, the first connecting arm 5686 can include more long arms. Two adjacent long arms, the first clipping portion 5682, and the first hooking portion 5684 can form one long slot for the first fins 524 to pass through. These long slots are not required to be the same in size but still have the function of locating the first heat sink 52 like the above. Furthermore, the first connecting arm 5686 has a pressing-against portion 5686b protruding toward the top wall 502. When the first attaching part 568 attaches the first heat sink 52 on the top wall 502, the first connecting arm 5686 presses the first base 522 on the top wall 502 through the pressing-against portion 5686b, as shown by FIG. 8. In practice, the first attaching part 568 can be made by pressing a metal sheet and therefore has a resilience in a certain degree; in other words, the first attaching part 568 resiliently presses the first base 522 through the pressing-against portion 5686b. Furthermore, in the embodiment, the first hooking portion 5684 of the first attaching part 568 is a U-shaped structure. The first hooking portion 5684 is engaged with the connecting part 562 by the U-shaped structure hooking the connecting part 562. The first engagement part 564 is a spring tab protruding outwards out of the first side wall 506. In practice, the first engagement part 564 and the first side wall 506 can be structurally integrated into a single part, e.g. by bending a portion of the first side wall 506 outwards to form the first engagement part 564. The first clipping portion 5682 has an engaging recess correspondingly. The first clipping portion 5682 detachably clips the first engagement part 564 by engaging the spring tab into the engaging recess. In practice, the first attaching part 568 can be formed by pressing a metal sheet and therefore has a resilience in a certain degree, and the spring tab also can offer a slight resilience by its structure; therefore, the first clipping portion 5682 and the first engagement part 564 are resiliently engaged with each other.

In addition, in the embodiment, the first attaching part 568 and the second attaching part 570 are structurally the same and are disposed oppositely on the casing 50. Therefore, for descriptions of the second attaching part 570 and variants thereof, please refer to the relevant descriptions of the first attaching part 568, which will not repeated in addition. Similarly, in the embodiment, the second engagement part 566 is also a spring tab protruding outwards out of the second side wall 508. In practice, the second engagement part 566 and the second side wall 508 can be structurally integrated into a single part, e.g. by bending a portion of the second side wall 508 outwards to form the second engagement part 566.

Figure 6:
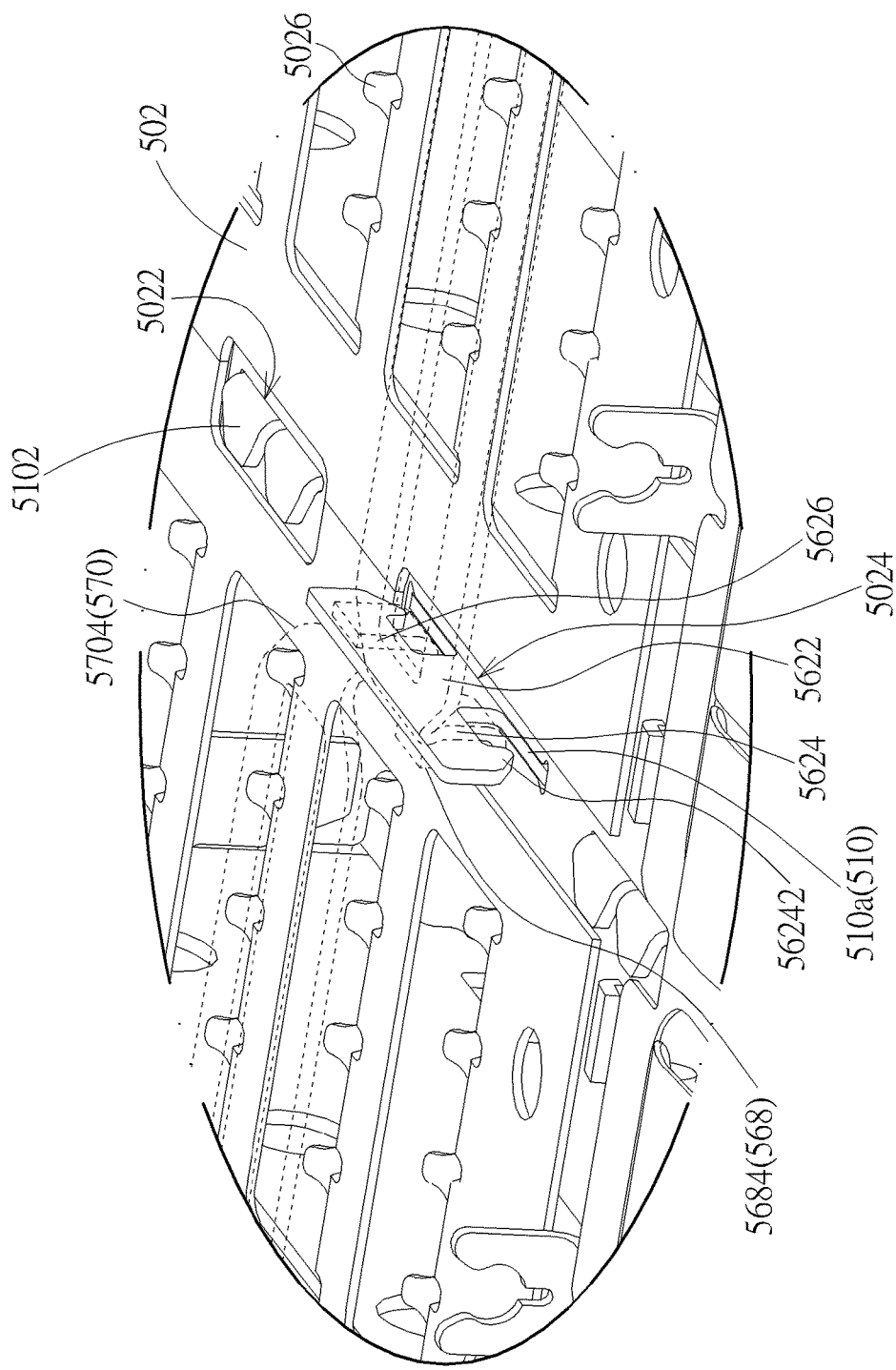
FIG. 6 is a schematic diagram illustrating an engagement of a connecting part of a heat sink attaching structure with a top wall of the casing of the electrical connector cage assembly in FIG. 3.

As shown by FIG. 6, in the embodiment, the connecting part 562 is substantially located at the middle portion of the top wall 502 and includes a fixed portion 5622, a first hooked portion 5624, and a second hooked portion 5626. The fixed portion 5622 protrusively fixedly disposed on the top wall 502. The first hooked portion 5624 and the second hooked portion 5626 extend outwards from two opposite sides of the fixed portion 5622 respectively. Thereby, the connecting part 562 as a whole shows a T-shaped structure. When the heat sink attaching structure 56 attaches the first heat sink 52 and the second heat sink 54 on the casing 50, the first hooking portion 5684 of the first attaching part 568 (shown by dashed lines in FIG. 6) hooks the first hooked portion 5624, and the second hooking portion 5704 of the second attaching part 570 (shown by dashed lines in FIG. 6) hooks the second hooked portion 5626. In the embodiment, the connecting part 562 extends from the side edge 510a of one of the partition plates 510. The top wall 502 has a through hole 5024 correspondingly. The connecting part 562 passes through the through hole 5024 to protrude out of the top wall 502. In practice, the connecting part 562 and the partition plate 510 are provided by a single part; however, the invention is not limited thereto. For example, the connecting part 562 is independent from the partition plate 510 and is fixedly connected to the top wall 502. For example, the connecting part 562 is formed by bending a portion of the top wall 502 upwards.

Furthermore, in the embodiment, the first hooked portion 5624 has a constraining structure 56242 located at an end of first hooked portion 5624 relative to the fixed portion 5622. When the first attaching part 568 attaches the first heat sink 52 on the top wall 502, the first hooking portion 5684 hooks the first hooked portion 5624 between the fixed portion 5622 and the constraining structure 56242; therefore, the constraining structure 56242 can prevent the first hooking portion 5684 from horizontally departing from the first hooked portion 5624. In addition, in the embodiment, the second hooked portion 5626 and the first hooked portion 5624 are structurally the same and are disposed at two opposite sides of the fixed portion 5622 respectively. Therefore, for descriptions about the second hooked portion 5626 and the interaction between the second hooked portion 5626 and the second hooking portion 5704, please refer to the above descriptions, which will not be described in addition.

In an actual operation of using the heat sink attaching structure 56 to attach the first heat sink 52 and the second heat sink 54 on the casing 50, the first hooking portion 5684 of the first attaching part 568 is disposed to hook the first hooked portion 5624 of the connecting part 562. Then, the first attaching part 568 is lifted upwards slightly so that the first heat sink 52 can be placed under the first attaching part 568. Then, the first attaching part 568 is pressed down to make the first clipping portion 5682 of the first attaching part 568 engage with the first engagement part 564, and the first connecting arm 5686 of the first attaching part 568 presses the first heat sink 52 accordingly, so that the first heat sink 52 abuts against the top wall 502. Therefore, attaching the first heat sink 52 on the top wall 502 is completed. The above manipulation to the first attaching part 568 can be applied to the second attaching part 570 for achieving the attachment of the second heat sink 54 on the top wall 502.

Furthermore, in the embodiment, the top wall 502 has a plurality of spring tabs 5026 protruding toward the interior of the accommodating space 50a and capable of abutting against electrical connectors installed in the accommodating space 50a. Therefore, the spring tabs 5026 have functions of transferring heat and fixing. In addition, in practice, a thermal pad (shown by dashed lines in FIG. 4) is placed between the top wall 502 and each of the first heat sink 52 and the second heat sink 54, for enhancing the thermal conduction between the top wall 502 and the heat sinks 52 and 54.

Figure 9:
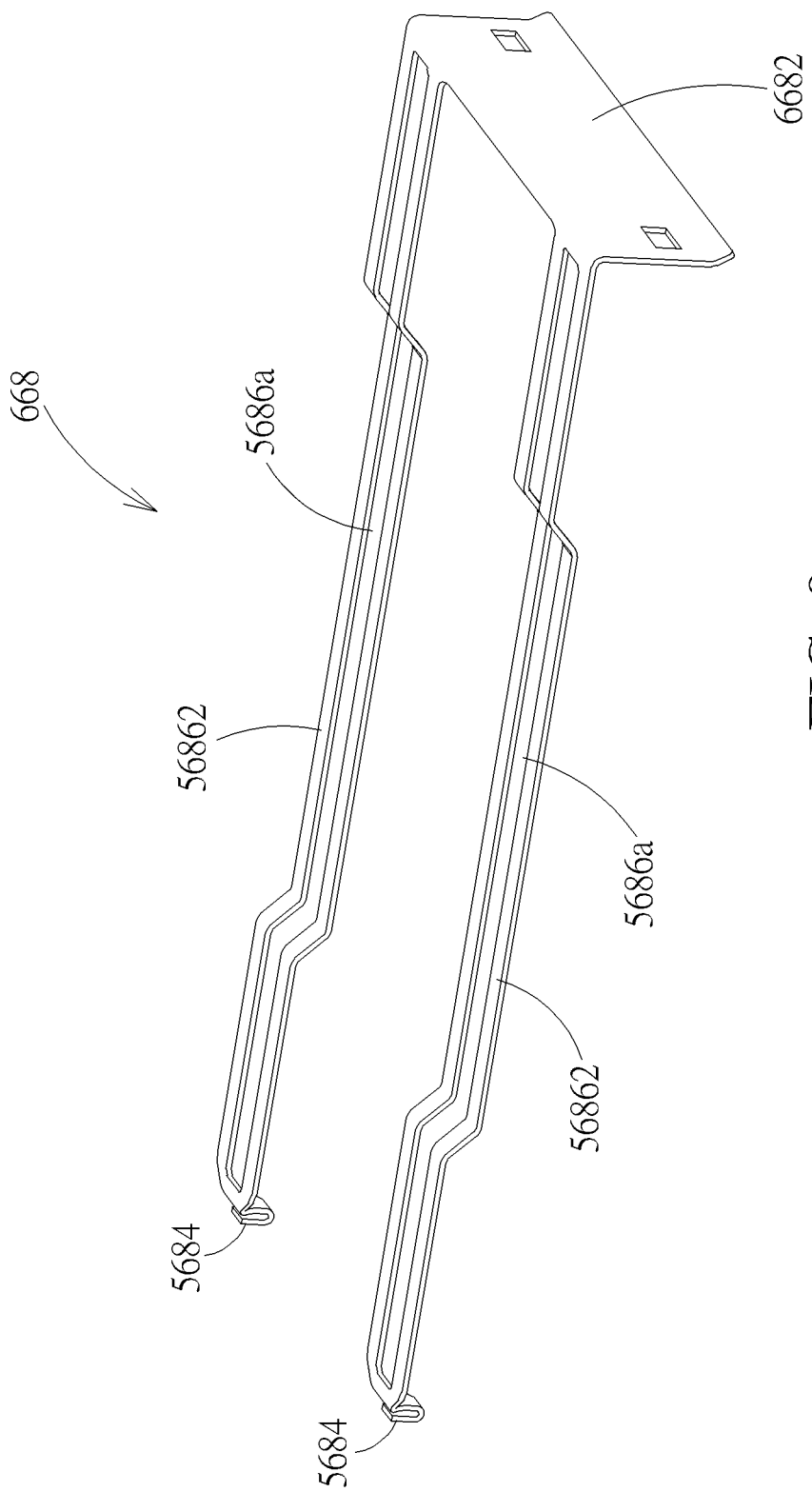
FIG. 9 is a schematic diagram illustrating a first attaching part according to another embodiment.

It is added that, in the embodiment, the engagement of the first clipping portion 5682 with the first engagement part 564 is achieved through only one structure; however, the invention is not limited thereto. For example, the first engagement part 564 can be provided by two spring tabs. The first clipping portion 5682 has two engaging recesses correspondingly, for engaging with the two spring tabs respectively. Similarly, in the embodiment, the engagement of the first hooking portion 5684 with the connecting part 562 is achieved through only one structure; however, the invention is not limited thereto. For example, the connecting part 562 can be provided by two T-shaped structures protrusively disposed on the top wall 502. The first hooking portion 5684 has two U-shaped structures correspondingly, for hooking the two T-shaped structures respectively. The above descriptions of variants of the first attaching part 568 are also applicable to the second attaching part 570, which will not be repeated. In addition, in the embodiment, the first heat sink 52 is actually attached on the top wall 502 by two first attaching parts 568 which can be structurally integrated into a single attaching part in practice. For example, as shown by FIG. 9, a first attaching part 668 is substantially equivalent to a structural combination of two first attaching parts 568 described above. A first clipping portion 6682 of the first attaching part 668 has two engaging recesses for engaging with two engagement parts 564 (realized by spring tabs) disposed on the first side wall 506, which can simplify the operation of the first attaching part 668. Furthermore, the first attaching part 668 as a whole is engaged with the casing 50 through three engagement structures, so the first heat sink 52 can be attached on the casing 50 firmly only by the first attaching part 668.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat sink attaching structure, comprising:
   a connecting part protruding out of a top wall of a casing;
   a first engagement part disposed on a first side wall of the casing;
   a second engagement part disposed on a second side wall of the casing, the first side wall and the second side wall being located at two opposite sides of the top wall;
   a first attaching part comprising a first clipping portion, a first hooking portion, and a first connecting arm, the first connecting arm connecting the first clipping portion and the first hooking portion, the first hooking portion being engaged with the connecting part and the first clipping portion detachably clipping the first engagement part for attaching a first heat sink on the top wall; and
   a second attaching part comprising a second clipping portion, a second hooking portion, and a second connecting arm, the second connecting arm connecting the second clipping portion and the second hooking portion, the second hooking portion being engaged with the connecting part and the second clipping portion detachably clipping the second engagement part for attaching a second heat sink on the top wall.

2. The heat sink attaching structure of claim 1, the first heat sink comprising a first base and a plurality of first fins, the first fins extending from the first base, the second heat sink comprising a second base and a plurality of second fins, the second fins extending from the second base, wherein the first connecting arm passes through the first fins and clips the first base on the top wall, the second connecting arm passes through the second fins and clips the second base on the top wall, the first connecting arm comprises at least two long arms, two ends of each long arm are connected to the first clipping portion and the first hooking portion respectively, adjacent two of the at least two long arms, the first clipping portion, and the first hooking portion form a long slot therebetween, and at least one of the first fins passes through the long slot.

3. The heat sink attaching structure of claim 2, wherein the first connecting arm has a pressing-against portion protruding toward the top wall, and the first connecting arm clips the first base on the top wall by the pressing-against portion pressing the first base.

4. The heat sink attaching structure of claim 1, wherein the connecting part comprises a fixed portion, a first hooked portion, and a second hooked portion, the fixed portion is protrusively fixedly disposed on the top wall, the first hooked portion and the second hooked portion extend outwards from two opposite sides of the fixed portion respectively, the first hooking portion hooks the first hooked portion, and the second hooking portion hooks the second hooked portion.

5. The heat sink attaching structure of claim 4, wherein the first hooking portion is a U-shaped structure.

6. The heat sink attaching structure of claim 4, wherein the first hooked portion has a constraining structure, the constraining structure is located at an end of the first hooked portion relative to the fixed portion, and the first hooking portion is located between the fixed portion and the constraining structure.

7. The heat sink attaching structure of claim 1, wherein the first engagement part is a spring tab protruding outwards out of the first side wall, the first clipping portion has an engaging recess, and the first clipping portion detachably clips the first engagement part by engaging the spring tab into the engaging recess.

8. An electrical connector cage assembly, comprising:
a casing having a top wall, a first side wall, and a second side wall, the first side wall and the second side wall being oppositely connected to two opposite sides of the top wall respectively, the top wall, the first side wall, and the second side wall forming an accommodating space therebetween, the accommodating space being capable of accommodating at least one electrical connector;
a first heat sink comprising a first base and a plurality of first fins, the first fins extending from the first base;
a second heat sink comprising a second base and a plurality of second fins, the second fins extending from the second base; and
a heat sink attaching structure, comprising:
a connecting part protruding out of the top wall;
a first engagement part disposed on the first side wall;
a second engagement part disposed on the second side wall of the casing;
a first attaching part comprising a first clipping portion, a first hooking portion, and a first connecting arm, the first connecting arm connecting the first clipping portion and the first hooking portion, the first hooking portion being engaged with the connecting part and the first clipping portion detachably clipping the first engagement part for attaching the first heat sink on the top wall; and
a second attaching part comprising a second clipping portion, a second hooking portion, and a second connecting arm, the second connecting arm connecting the second clipping portion and the second hooking portion, the second hooking portion being engaged with the connecting part and the second clipping portion detachably clipping the second engagement part for attaching the second heat sink on the top wall.

9. The electrical connector cage assembly of claim 8, wherein the first connecting arm passes through the first fins and clips the first base on the top wall, the second connecting arm passes through the second fins and clips the second base on the top wall, the first connecting arm comprises at least two long arms, two ends of each long arm are connected to the first clipping portion and the first hooking portion respectively, adjacent two of the at least two long arms, the first clipping portion, and the first hooking portion form a long slot therebetween, and at least one of the first fins passes through the long slot.

10. The electrical connector cage assembly of claim 8, wherein the first connecting arm has a pressing-against portion protruding toward the top wall, and the first connecting arm clips the first base on the top wall by the pressing-against portion pressing the first base.

11. The electrical connector cage assembly of claim 8, wherein the connecting part comprises a fixed portion, a first hooked portion, and a second hooked portion, the fixed portion is protrusively fixedly disposed on the top wall, the first hooked portion and the second hooked portion extend outwards from two opposite sides of the fixed portion respectively, the first hooking portion hooks the first hooked portion, and the second hooking portion hooks the second hooked portion.

12. The electrical connector cage assembly of claim 11, wherein the first hooking portion is a U-shaped structure.

13. The electrical connector cage assembly of claim 11, wherein the first hooked portion has a constraining structure, the constraining structure is located at an end of the first hooked portion relative to the fixed portion, and the first hooking portion is located between the fixed portion and the constraining structure.

14. The electrical connector cage assembly of claim 8, wherein the first engagement part is a spring tab protruding outwards out of the first side wall, the first clipping portion has an engaging recess, and the first clipping portion detachably clips the first engagement part by engaging the spring tab into the engaging recess.

15. The electrical connector cage assembly of claim 8, wherein the casing comprises a partition plate disposed in the accommodating space and dividing the accommodating space, the top wall has a through hole, and the connecting part extends from a side edge of the partition plate to protrude out of the top wall through the through hole.

16. The electrical connector cage assembly of claim 15, wherein the partition plate and the connecting part are provided by a single part.

17. The electrical connector cage assembly of claim 16, wherein the top wall, the first side wall, and the second side wall are provided by a single part, the top wall has an engagement hole, the partition plate has a bent portion at the side edge, and the bent portion protrudes out of the top wall and engages with the engagement hole.

\* \* \* \* \*